United States Patent
You et al.

(10) Patent No.: US 9,620,491 B2
(45) Date of Patent: Apr. 11, 2017

(54) ORGANIC LIGHT EMITTING DIODE DISPLAY DEVICE

(71) Applicant: Samsung Display Co., Ltd., Yongin, Gyeonggi-Do (KR)

(72) Inventors: Young-Min You, Yongin (KR); Dae-Kil Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/715,465

(22) Filed: May 18, 2015

(65) Prior Publication Data
US 2015/0255445 A1 Sep. 10, 2015

Related U.S. Application Data

(63) Continuation of application No. 13/960,668, filed on Aug. 6, 2013, now Pat. No. 9,035,290.

(30) Foreign Application Priority Data

Apr. 3, 2013 (KR) .......................... 10-2013-0036505

(51) Int. Cl.
| H01L 25/18 | (2006.01) |
| H01L 51/52 | (2006.01) |
| H01L 51/00 | (2006.01) |
| H01L 27/28 | (2006.01) |
| H01L 27/32 | (2006.01) |

(52) U.S. Cl.
CPC .............. *H01L 25/18* (2013.01); *H01L 27/28* (2013.01); *H01L 27/32* (2013.01); *H01L 51/0097* (2013.01); *H01L 51/5237* (2013.01); *H01L 51/5246* (2013.01); *H01L 51/5284* (2013.01); *H01L 2227/32* (2013.01); *H01L 2251/5338* (2013.01); *H01L 2924/0002* (2013.01)

(58) Field of Classification Search
CPC .................................................. H01L 2227/32
See application file for complete search history.

(56) References Cited

U.S. PATENT DOCUMENTS

| 2003/0143423 A1* | 7/2003 | McCormick ........ H01L 51/5237 428/690 |
| 2006/0158861 A1* | 7/2006 | Shouji ................ H01L 23/4985 361/750 |

(Continued)

FOREIGN PATENT DOCUMENTS

| KR | 10-2009-0053681 | 5/2009 |
| KR | 10-2010-0063172 | 6/2010 |
| KR | 10-2010-0072652 | 7/2010 |

*Primary Examiner* — Michael Lebentritt
*Assistant Examiner* — Jordan Klein
(74) *Attorney, Agent, or Firm* — Lewis Roca Rothgerber Christie LLP

(57) ABSTRACT

An organic light emitting diode (OLED) display includes: a substrate including a plurality of organic light emitting elements; an adhesive member on at least a portion of an upper surface of the substrate; a flexible circuit board adhered to the upper surface of the adhesive member and having a portion bent to be mounted to a lower surface of the substrate; and a light blocking member at the upper surface of the substrate, wherein the light blocking member is laterally offset from the adhesive member.

15 Claims, 2 Drawing Sheets

(56) References Cited

U.S. PATENT DOCUMENTS

| | | | |
|---|---|---|---|
| 2007/0012489 A1* | 1/2007 | Kim | G06F 1/1624 178/18.01 |
| 2009/0148678 A1* | 6/2009 | Hwang | H05K 1/0281 428/209 |
| 2009/0213292 A1* | 8/2009 | Park | G02F 1/13452 349/58 |
| 2009/0256471 A1* | 10/2009 | Kim | H01L 51/5237 313/504 |
| 2009/0322214 A1* | 12/2009 | Lee | H05B 33/04 313/504 |
| 2010/0142178 A1* | 6/2010 | Yee | H05K 5/0017 361/829 |
| 2010/0156765 A1* | 6/2010 | Park | H01L 27/3232 345/77 |
| 2011/0273906 A1* | 11/2011 | Nichol | G02B 6/0076 362/607 |
| 2012/0106122 A1* | 5/2012 | Ryu | G02F 1/133608 362/19 |
| 2014/0078692 A1* | 3/2014 | Park | H05K 7/02 361/749 |
| 2014/0203703 A1* | 7/2014 | Maatta | H01L 23/3121 313/504 |

* cited by examiner

ORGANIC LIGHT EMITTING DIODE DISPLAY DEVICE

CROSS-REFERENCE TO RELATED APPLICATION

This application is a continuation of U.S. patent application Ser. No. 13/960,668, filed Aug. 6, 2013, which claims priority to and the benefit of Korean Patent Application No. 10-2013-0036505, filed Apr. 3, 2013, the entire content of both of which is incorporated herein by reference.

BACKGROUND

1. Field

The present disclosure relates to an organic light emitting diode (OLED) display.

2. Description of the Related Art

An OLED display includes organic light emitting elements including a hole injection electrode, an organic emission layer, and an electron injection electrode. Each organic light emitting element emits light by energy generated when an exciton generated by combining an electron and a hole in the organic emission layer falls from an exited state to a ground state, and the OLED display displays an image (e.g., a predetermined image) by using this light emission. Thus, the OLED display has a self-luminance characteristic and a separate light source is not required (unlike a liquid crystal display), which enables an OLED display to have a relatively smaller thickness and weight compared to other types of display devices. Further, because the OLED display exhibits high quality characteristics such as relatively low power consumption, high luminance, and rapid response speed, the OLED display is receiving attention as a next generation display device.

An OLED display may include a flexible circuit board coupling the substrate outputting the image to the main board. Also, the main board and the surrounding members may be adhered by an adhesive tape. To couple the members positioned at different positions, the flexible circuit board is made of a material having flexibility and an elastic force (e.g., predetermined elastic force). However, the elastic force of the flexible circuit board is transmitted to the main board such that the adhesive tape may be lifted or separated from, the surrounding members.

The above information disclosed in this Background section is only for enhancement of understanding of the background of the invention and therefore it may contain information that does not form the prior art that is already known in this country to a person of ordinary skill in the art.

SUMMARY

An exemplary embodiment of the present invention provides an OLED display configured to prevent, substantially prevent, or reduce lifting or separating of an adhesive tape.

An OLED display of an embodiment of the present invention includes: a substrate comprising a plurality of organic light emitting elements; an adhesive member on at least a portion of an upper surface of the substrate; a flexible circuit board adhered to the upper surface of the adhesive member and having a portion bent to be mounted to a lower surface of the substrate; and a light blocking member at the upper surface of the substrate, wherein the light blocking member is laterally offset from the adhesive member.

The light blocking member may be separated from the adhesive member by a distance.

The distance may be in a range of 0.5 mm to 0.7 mm.

A length of the adhesive member may be in a range of 3.3 mm to 3.5 mm.

The substrate may comprise a display area and a non-display area, the adhesive member may be at the non-display area, and the light blocking member may be at the display area.

The light blocking member may comprise a black tape.

The adhesive member is may comprise a double-sided adhesive tape comprising an adhesive on opposing sides of the double-sided adhesive tape.

The light blocking member may be at a surface opposite a surface where the plurality of organic light emitting elements of the substrate are configured to display an image.

In the OLED display according to an embodiment of the present invention, the light blocking member and the adhesive member do not overlap each other (e.g., are laterally offset). Therefore, although an external force may be applied to move the flexible circuit board in a direction away from the substrate by the elastic force of the flexible circuit board, the flexible circuit board and the substrate may stably maintain or improve the adhesion state by the adhesive member. Accordingly, the flexible circuit board may not be separated from the substrate such that the combination reliability (e.g., adhesion between components) of the OLED display according to an embodiment of the present invention may be improved.

DETAILED DESCRIPTION

Figure 1:
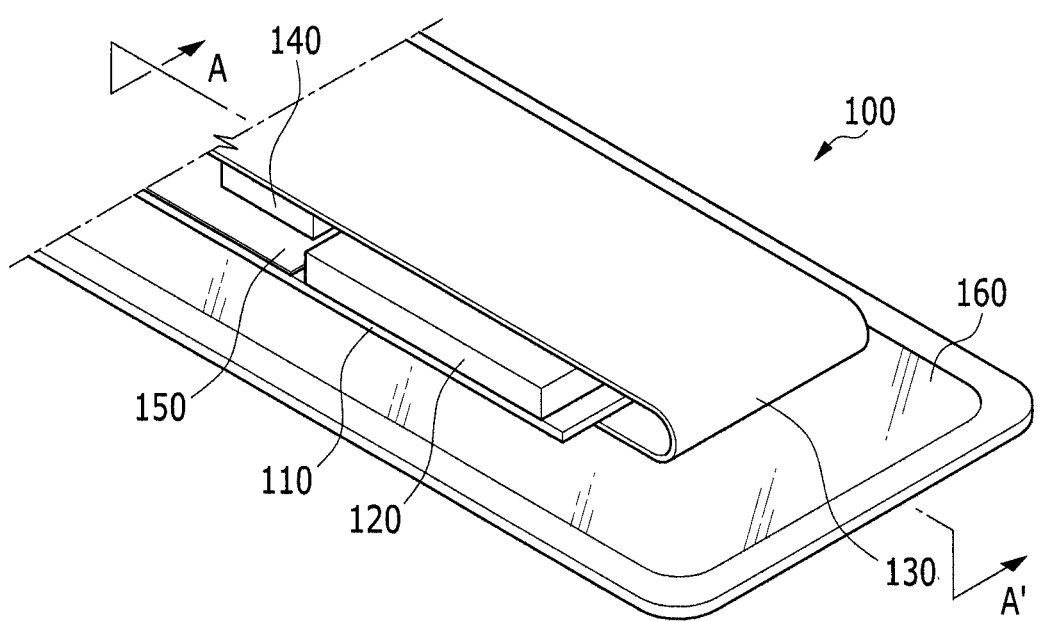
FIG. 1 is a perspective view of an OLED display according to an embodiment.

Hereinafter, example embodiments will be described in detail with reference to the accompanying drawings so that those skilled in the art to which the present invention pertains can realize the present invention. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

Prior to description of the core structure of embodiments of the present invention, portions of the structure of an OLED display according to an embodiment will be described.

Figure 2:
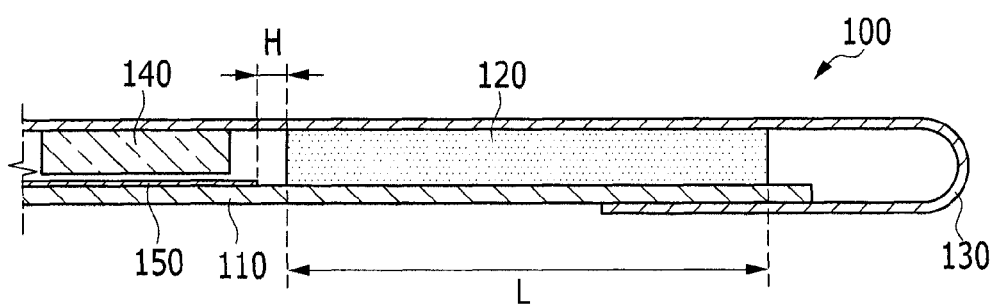
FIG. 2 is a cross-sectional view of the OLED display shown in FIG. 1 taken along the line A-A'.

FIG. 1 is a perspective view of an OLED display according to an embodiment, and FIG. 2 is a cross-sectional view of the OLED display shown in FIG. 1, taken along the line A-A'.

Referring to FIG. 1 and FIG. 2, an OLED display 100 according to an embodiment includes a substrate including a plurality of organic light emitting elements 110, an adhesive member 120, a flexible circuit board 130, and a light blocking member 150.

The plurality of organic light emitting elements may be patterned and formed on the substrate 110. The organic light emitting elements may be any type such as a passive type or an active matrix type. Also, in one embodiment a material and a configuration of the organic light emitting element are not limited such that a detailed description thereof is omitted.

A polarizer (not shown) may be positioned on one surface of the substrate 110. The polarizer aligns the direction of passing light, thereby incident light is divided into two polarization components, and only one component of them may be passed and the other component may be absorbed or dispersed.

An adhesive member 120 is formed on at least a portion of an upper surface of the substrate 110. In one embodiment, the adhesive member 120 may be formed to extend along the edge of the upper surface of the substrate 110. An example of the adhesive member 120 may be a double-sided adhesive tape of which both opposing surfaces are formed as an adhesive surface, with a suitable adhesive material deposited or formed over the opposing surfaces of the adhesive member 120. One surface of the adhesive member 120 is adhered to the substrate 110 and an opposing surface of the adhesive member 120 is adhered to a flexible circuit board 130 that will be described later, thereby combining or adhering the substrate 110 and the flexible circuit board 130.

The flexible circuit board 130 is adhered to the upper surface of the adhesive member 120. A portion of the flexible circuit board 130 is bent to be mounted (e.g., adhered or attached) to a lower surface of the substrate 110. In one embodiment, the flexible circuit board 130 may be a flexible printed circuit film.

A driver integrated circuit 140 (a driver IC) may be formed or positioned at one surface of the flexible circuit board 130. The driver IC 140 is electrically coupled to the organic light emitting element to control an operation of the organic light emitting element.

In one embodiment, the driver IC 140 is formed or positioned at one surface of the flexible circuit board 130 as a chip on film (COF) type, however, it is not limited thereto. Alternatively, in a state that the driver IC 140 is electrically coupled to the substrate 110, one end of the flexible circuit board 130 may be electrically coupled to the driver IC 140.

The light blocking member 150 is positioned to not overlap (e.g., is laterally offset from) the adhesive member 120 at the upper surface of the substrate 110. That is, the light blocking member 150 may be formed or positioned at a surface opposite to the surface at which the image is output by a plurality of organic light emitting elements in the substrate 110. In one embodiment, in the OLED display 100 as shown in FIG. 1, the image is output or displayed at the lower side or surface of the substrate 110 such that the light blocking member 150 may be formed or positioned at the upper surface of the substrate 110. Also, a window 160 may be positioned adjacent the lower surface of the substrate 110 where the image is output or displayed.

A position where the light blocking member 150 is formed will be described in more detail. When the adhesive member 120 is formed along the edge at the upper surface of the substrate 110, the light blocking member 150 may be formed in an inner region excluding the edge at the upper surface of the substrate 110.

An example of the light blocking member 150 may be a black tape. The light blocking member 150 has a film shape and may be, for example, opaque with a black or other suitable color so as to not transmit light, and an adhesive layer or material may be formed on the light blocking member 150. The light blocking member 150 has a function of preventing or substantially preventing members near the substrate 110 from being visible to the outside and improving visibility of the image output from the substrate 110.

In one embodiment, in the OLED display 100, the light blocking member 150 may be formed to be separated from the adhesive member 120 by a distance (e.g., a predetermined distance). That is, a gap may be formed between the light blocking member 150 and the adhesive member 120. Differently from the structure in which the light blocking member 150 is adjacent to the end of the adhesive member 120, in the above structure, the light blocking member 150 and the adhesive member 120 may not be clearly overlapped with each other. In one embodiment, during the manufacturing process of the OLED display 100, even if a worker is not skilled or if there are manufacturing variances, in a process of adhering the light blocking member 150 and the adhesive member 120 to the substrate 110, the light blocking member 150 and the adhesive member 120 may be adhered to the substrate 110 while not being overlapped with each other. That is, by designing the light blocking member 150 to be separated from the adhesive member 120 by a distance, even accounting for manufacturing variances or errors, the light blocking member 150 and the adhesive member 120 may be laterally offset.

The described substrate 110 may include a display area and a non-display area. In this case, the adhesive member 120 may be formed in the non-display area and the light blocking member 150 may be formed in the display area. The display area is a part in which a plurality of organic light emitting elements (not shown) are pattered in the substrate 110. That is, the display area is the portion of the OLED display 100 configured to output or display the image.

The non-display area, as a part in which that a plurality of organic light emitting elements are not formed in the substrate 110, may be formed with a sealant to combine a glass (not shown) of the substrate 110 and a encapsulator (not shown) to encapsulate the organic light emitting element on the glass. The substrate 110 may be manufactured using a low temperature polycrystalline silicon (LTPS) method, however it is not limited thereto.

Also, in the substrate 110, a scan driver (not shown) and a data driver (not shown) for driving the pixels may be positioned between the display area and the sealant (not shown) and outside the sealant. Also, pad electrodes (not shown) to transmit electrical signals to the scan driver and the data driver may be formed in the display area.

As described above, the adhesive member 120 is formed in the non-display area to not be exposed. In one embodiment, when the OLED display 100 is mounted to a portable device, the non-display area may be positioned at a bezel portion of the portable device (not shown). Also, the adhesive member 120 is positioned at the bezel part of the portable device such that the adhesive member 120 is not visible. Accordingly, an outward appearance of the portable device may be more aesthetically appealing.

A length L of the adhesive member 120 may be in a range of 3.3 mm to 3.5 mm. Here, the length L of the adhesive member 120 is the length L of the adhesive member 120 relative to a left and right direction in FIG. 2. If the length L of the adhesive member 120 is less than 3.3 mm, the adhesive force of the substrate 110 and the flexible circuit board 130 may be relatively weak such that the substrate 110 or the flexible circuit board 130 may be more easily separated from the adhesive member 120. Also, if the length L of the adhesive member 120 is over 3.5 mm, the adhesive member 120 may interfere with the adjacent light blocking member 150.

In one embodiment, when mounting the OLED display 100 to a portable device, the adhesive member 120 may be positioned at a part corresponding to the bezel of the portable device such that the area of the bezel is increased as an area of the adhesive member 120 is significantly increased. Accordingly, when the display area of the portable device is fixed, the area of the bezel is widened such that the portable device is more difficult to grip.

In one embodiment, in the OLED display 100, the length of the adhesive member 120 is in a range of 3.3 mm to 3.5 mm such that the adhesive member 120 and the light blocking member 150 do not overlap each other (e.g., are laterally offset or separated), which may help to avoid increasing of the area of the bezel of the portable device in which the OLED display 100.

The light blocking member 150 may be separated from the adhesive member 120 by 0.5 mm to 0.7 mm. That is, an interval H between the light blocking member 150 and the adhesive member 120 may be in a range of 0.5 mm to 0.7 mm. If the interval H between the light blocking member 150 and the adhesive member 120 is designed to be less than 0.5 mm, the light blocking member 150 and the adhesive member 120 may be so close to each other such that variances during the manufacturing process may cause the light blocking member 150 and adhesive member 120 to overlap.

If the interval H between the light blocking member 150 and the adhesive member 120 is over 0.7 mm, the width of the non-display area may require that the area of the bezel of the portable device corresponding to the non-display area is increased as described above, and resultantly the ability to grip the portable device may be deteriorated.

In one embodiment, in the OLED display 100, the light blocking member 150 is separated from the adhesive member 120 by a distance in a range of 0.5 mm to 0.7 mm to prevent or reduce the overlapping of the light blocking member 150 and the adhesive member 120 such that the adhesive member 120 may be prevented or substantially prevented from being lifted from the light blocking member 150. Also, by reducing the area of the non-display area, the area of the bezel of the portable device in which the OLED display 100 is mounted may also be reduced, thereby improving the grip.

As described above, in the OLED display 100 according to one embodiment, the light blocking member 150 and the adhesive member 120 are positioned to not overlap each other. Therefore, although an external force is applied to move the flexible circuit board 130 in a direction away from the substrate 110 by the elastic force of the flexible circuit board 130, the flexible circuit board 130 and the substrate 110 may stably maintain or improve the adhesion state by the adhesive member 120. Accordingly, the flexible circuit board 130 may not be separated from the substrate 110 such that the combination reliability (e.g., the reliability of the adhesion between the components) of the OLED display 100 according to one embodiment may be improved.

The drawings referred to in the above and disclosed detailed description of the present invention only illustrate the present invention, and are intended to describe the present invention, not to restrict the meanings or limit the scope of the present invention claimed in the claims. Therefore, those skilled in the art can understand that various modifications and other equivalent example embodiment may be made therefrom. Accordingly, the true technical protection scope of the present invention must be determined by the technical spirit of the accompanying claims, and their equivalents.

<Description of Some of the Reference Numerals>

| | |
|---|---|
| 100: organic light emitting diode (OLED) display | 110: substrate |
| 120: adhesive member | 130: flexible circuit board |
| 140: driver integrated circuit | 150: light blocking member |
| 160: window | |

What is claimed is:

1. An organic light emitting diode (OLED) display comprising:
    a substrate comprising a plurality of organic light emitting elements;
    an adhesive member on at least a portion of a first surface of the substrate;
    a flexible circuit board having a first end coupled to a second surface of the substrate; and
    a light blocking member at the first surface of the substrate, wherein the light blocking member is laterally offset from the adhesive member,
    wherein the flexible circuit board contacts the adhesive member on the first surface of the substrate, and
    the flexible circuit board overlaps the light blocking member and the adhesive member when viewed in a direction perpendicular to the first surface of the substrate.

2. The organic light emitting diode (OLED) display of claim 1, further comprising a driving IC coupled to the first end of the flexible circuit board.

3. The organic light emitting diode (OLED) display of claim 2, wherein the driving IC is between the flexible circuit board and the substrate.

4. The organic light emitting diode (OLED) display of claim 2, wherein the driving IC is below the first end of the flexible circuit board.

5. The organic light emitting diode (OLED) display of claim 1, further comprising a driving IC coupled to a second end of the flexible circuit board.

6. The organic light emitting diode (OLED) display of claim 5, wherein the driving IC and the light blocking member face each other.

7. The OLED display of claim 1, wherein
    the light blocking member is separated from the adhesive member by a distance.

8. The OLED display of claim 7, wherein
    the distance is in a range of 0.5 mm to 0.7 mm.

9. The OLED display of claim 1, wherein
    a length of the adhesive member is in a range of 3.3 mm to 3.5 mm.

10. The OLED display of claim 1, wherein
    the substrate comprises a display area and a non-display area,
    the adhesive member is at the non-display area, and
    the light blocking member is at the display area.

11. The organic light emitting diode (OLED) display of claim 1, wherein the light blocking member comprises a light blocking material.

12. The organic light emitting diode (OLED) display of claim 11, wherein the light blocking member is formed by coating the light blocking material to the first surface of the substrate.

13. The OLED display of claim 1, wherein the light blocking member comprises a black tape.

14. The OLED display of claim 1, wherein the adhesive member comprises a double-sided adhesive tape comprising an adhesive on opposing sides of the double-sided adhesive tape.

15. The OLED display of claim 1, wherein the light blocking member is at a surface opposite a surface where the plurality of organic light emitting elements of the substrate are configured to display an image.

* * * * *